United States Patent [19]

Wilson

[11] 4,276,441
[45] Jun. 30, 1981

[54] THERMOELECTRIC GENERATOR AND METHOD OF FORMING SAME

[75] Inventor: Kenneth T. Wilson, Ocala, Fla.

[73] Assignee: Wilson International Incorporated, Ocala, Fla.

[21] Appl. No.: 117,342

[22] Filed: Feb. 15, 1980

[51] Int. Cl.³ .................. H01L 35/00; H01L 35/28
[52] U.S. Cl. ........................... 136/206; 29/573; 136/211; 136/225; 136/227
[58] Field of Search ............. 136/206, 211, 212, 225, 136/227; 29/573

[56] References Cited

U.S. PATENT DOCUMENTS

| | | | |
|---|---|---|---|
| 3,071,495 | 1/1963 | Hanlein | 136/212 X |
| 3,284,245 | 11/1966 | Nottage et al. | 136/212 |
| 3,981,751 | 9/1976 | Dashevsky et al. | 136/212 |
| 4,098,617 | 7/1978 | Lidorenko et al. | 136/225 X |
| 4,111,717 | 9/1978 | Baxter | 136/225 |

Primary Examiner—Leland A. Sebastian
Attorney, Agent, or Firm—Alfred E. Wilson

[57] ABSTRACT

A thermoelectric device is disclosed which comprises the formation of a multiplicity of thermocouples on a substrate in a narrow strip form, the thermocouples being formed by printing with first and second inks formed of suitable different powdered metals with a proper binder or flux. The thermocouples are formed in series and the opposed coupled areas are melted to form an intermingling of the two metals and the strips may be formed in substantial lengths and rolled onto a reel, or in relatively short strip form and disposed in a side-by-side abutting relationship in substantial numbers to define a generally rectangular panel form with opposed ends in electrical connection. The method of forming the panels includes the steps of feeding a suitable substrate, either in a continuous roll or sheet form, through first and second printers to form the series connected multiplicity of thermocouples thereon. From the printers the sheet or strip passes through a melter such as an induction furnace and from the furnace it passes through a sheeter, if the strip is in roll form. The sheets are then slit into narrow strips relative to the thermocouples, printed thereon and the strips are then formed into a bundle. A predetermined number of bundles are assembled into a panel form.

16 Claims, 7 Drawing Figures

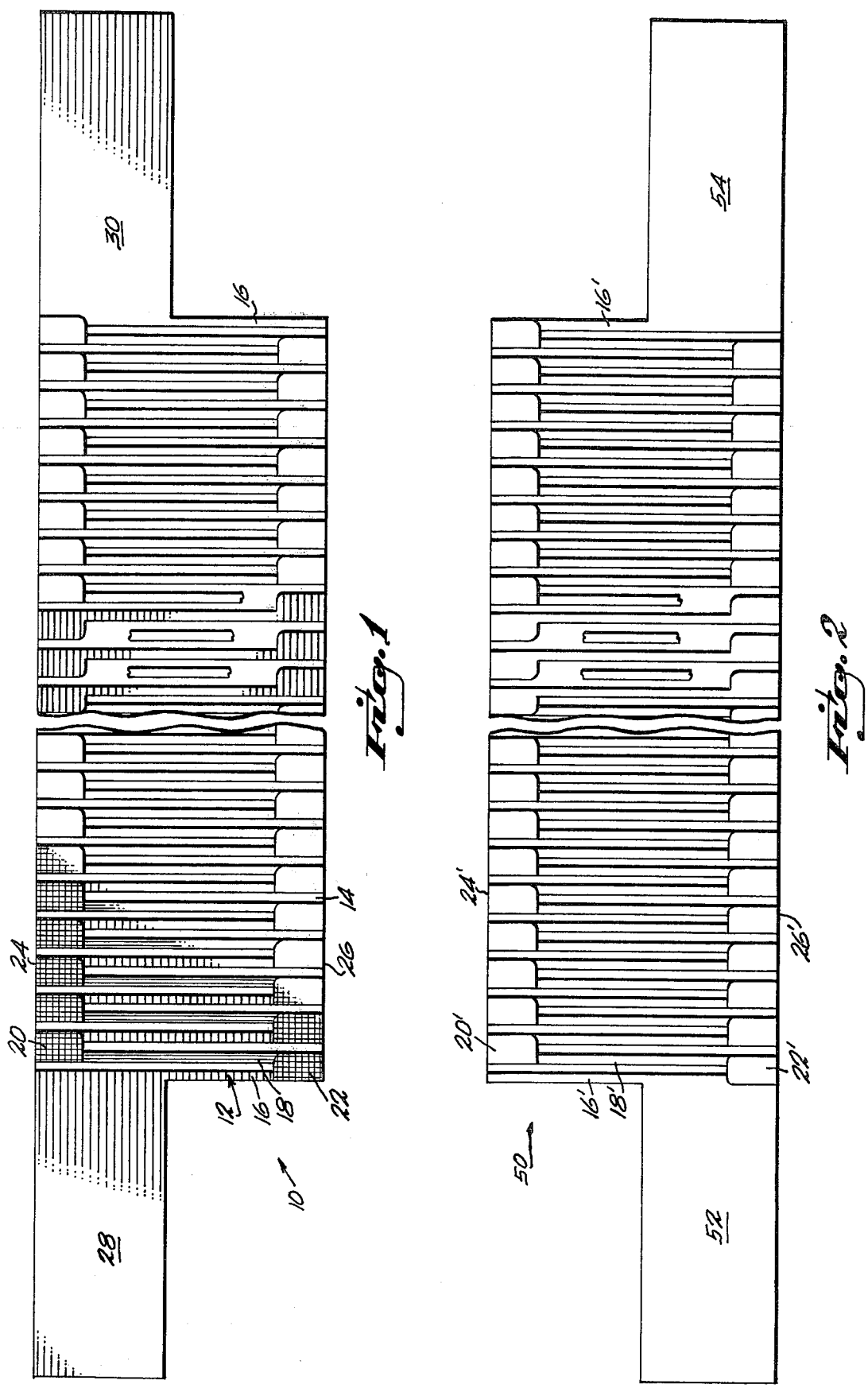

THERMOELECTRIC GENERATOR AND METHOD OF FORMING SAME

STATE OF THE PRIOR ART

In 1821, T. J. Seebeck discovered that when two different conductors are joined into a loop and a temperature differential is maintained between the two end junctions, an electromotive force is generated. Such a loop is called a thermocouple and is a generator of thermoelectric or Seebeck EMF.

In 1843, J. C. A. Peltier discovered that when electric current passes through two different conductors, connected in a loop, one of two junctions between the conductors cools and the other junction warms. If the direction of the current is reversed, the effect also reverses, the first junction warms and the second junction cools.

In 1853 Quintus Icilus showed that the rate of heat output or intake at each junction is directly proportional to the current.

In 1854, William Thompson, in an attempt to explain discrepancies between experimental results concerning the changing temperature in a conductor when the conductors temperature changed, determined this heat, called Thompson Heat, is proportional to the product of the current and temperature gradient. It is reversable in the sense that the conductor changes from a generator of Thompson Heat to an absorber of Thompson Heat when the direction of either the current or temperature gradient, but not both at once, is reversed.

BACKGROUND OF THE PRESENT INVENTION

Heretofore, thermal generators have been greatly limited in their voltage production because of the construction of the thermocouples, said construction employing the use of solid metal wires, tapes, bars and the like.

The device of the present invention incorporates the use of two dissimilar powdered metals which are individually mixed with a suitable binder or flux which is printed on a suitable substrate having high thermal and electrical insulating properties.

It is the intent and scope of the present invention to directly convert the heat energy resulting from solar radiation as well as other forms of heat energy into electrical energy without moving parts, and in a manner that is neither energy or material intensive, by utilizing the Seebeck effect. One of the requirements to the production of thermoelectricity is that the temperature of one of the two junctions of each thermocouple must be elevated relative to the other. The greater the temperature differential, the greater the voltage potential between the two junctions. These voltages are very small. For example a chromel-constanton couple with a 100 degree centigrade temperature differential 0 degrees to 100 degrees C., the voltage would be 6.317 milivolts. Therefore a thousand such junctions, electrically in series, will produce 6.137 volts.

It is therefore apparent that in order to make a substantial use of thermoelectricity we must have two specifics: one, a great number of junctions and, second the greatest possible temperature differential. The manner in which thermocouples are currently produced is by fusing two different metals together in a metal wire, ribbon or bar form. The high temperature fusion is a weld where the two surfaces are melted together so that there is an intermixing of the metals at their junction surfaces.

One of the most significant differences in the approach of the instant invention concerns the manner by which the thermocouples are formed. Instead of starting with solid metals such as wire, flattened wire, ribbon or bars, powdered metals, very finely divided and mixed with a proper binder or flux to form a metallic ink, are used to print a multiplicity of thermocouples in series on a suitable substrate. This printing may be done via a silk screen method or by offset, lithographic or letterpress printing processes. The couples will be printed in a sequential manner, a copper, for example may go on first and then a constatan will go over the copper. They are then passed through an induction furnace where the metals are melted, due to the heat produced within the metal particles themselves. A microwave oven or a lazer controlled fuser may be employed instead of the induction furnace. An electrical path with solid metal is therefore guaranteed. Good couples are also guaranteed by an intermingling of the metals at said couples.

Therefore, one of the principal objects of the present invention is to provide a thermoelectric generator device utilizing a multiplicity of thermocouples defined in series on a narrow tape which may be rolled in a reel form or disposed in great numbers in an electrically interconnected strip form to define a generally rectangular panel.

A further principal object of the invention is to provide the two different metals in a fine powder form for mixture with an appropriate binder or flux to form a metallic ink for use with any of a variety of conventional printing processes for application to a suitable substrate.

Another object of the invention is to provide a means to enhance the temperature differential between the hot and cold sides of the thermocouples of alternating strips by providing an electrical connection between the bottom or cold side of a first of every pair of thermocouple strips to the top or hot side of a second strip thereof.

Yet another object of the present invention is to provide a method of producing the thermoelectric generator of the present invention comprising the steps of feeding an appropriate substrate, in sheet form of a predetermined length and width, sequentially through first and second metallic ink printers to define a plurality of lines of thermocouples along the length of each sheet; passing each sheet through a melter, such as an induction furnace, to melt the powdered metal particles into a solid mass with an intermingling of particles at each couple; passing each sheet through a slitter to slit each sheet into a plurality of ribbon strips with one line of thermocouples along the length of each strip; passing each plurality of ribbon strips into a bundler to define a bundle thereof, passng the bundles to an assembly station for assembly into a panel form, and passing the panels to a final collection station.

A further object of the invention is to provide a sheeting station between the melting station and the slitter when a continuous roll of substrate is passed through the first and second printers, and the melter.

BRIEF DESCRIPTION OF THE DRAWINGS

FIG. 1 is a fragmentary enlarged elevational view of a first thermocouple strip of the present invention;

FIG. 2 is a similar elevational view of a second thermocouple strip;

DETAILED DESCRIPTION OF THE INVENTION

Figure 3:
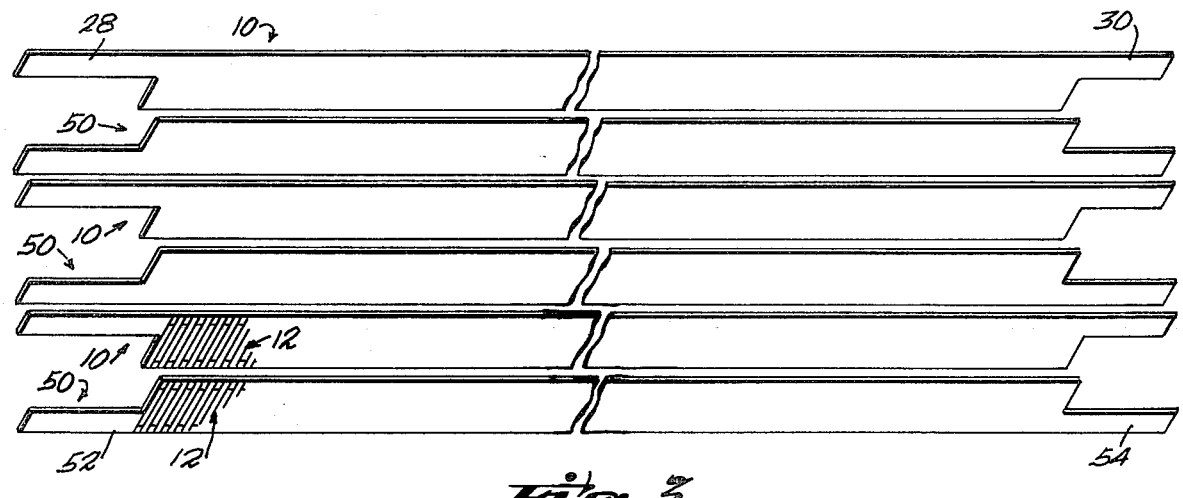
FIG. 3 is an isometric view of a plurality of alternating first and second strips in an exploded relation.

With reference to the drawings, and particularly to FIG. 1, a thermoelectric generator strip, indicated generally at 10 includes a plurality of thermocouples 12 disposed in series along an appropriate substrate strip 14 generally defining a pulsed square wave form. The thermocouples are formed of vertically spaced legs such as 16, 18 with oppositely projecting top and bottom couples 20, 22 connecting between pairs of legs 16, 18 in a manner so as to produce the pulsed square wave form. The thermocouple design 12 is printed on the substrate strip 14. A first powdered metal such as copper is mixed with a suitable binder or flux and printed on the substrate to define the first legs 16, and the constantan or second metal is similarly prepared from a powdered form and printed on the strip 14 to define the second legs 18 and the couples 20, 22. It should be noted that, the couples 20, comprise the normally hot edge 24 and the couples 22 the normally cold lower edge 26. The strip is then subjected to a heat source such as an induction furnace to melt the powdered metals into solid masses while causing an intermingling of the couples 20, 22.

A pair of connector tabs 28, 30 coated with the first metal such as copper, electrically connect to end first legs 16, and extend outwardly from opposed upper side edge portions of strips 14.

The printing is done on a relatively narrow strip, approximately one-quarter to one-half an inch in width in the pulsed square wave form as described. The printed thermocouple design will function the same as couples made of wire or metal ribbon, except for the fact that it can be printed much faster, much closer and smaller than could be fabricated from wire or ribbon. The substrate strip 14 is made of a high temperature and electrical insulating material that can be in the order of one to two thousandths of an inch in thickness.

The thermocouples will be printed at least 100 per linear inch of strip of substrate 14.

The prime purpose for printing and using vast numbers of thermocouples is to enable the use of a much smaller differential between upper or hot junctions and the lower or cold junctions with a large energy capability. The chromel constantan has a constant of 6.317 milivolts at 100 degrees centigrade differential and if a differential of only 20 degrees is produced, there will be 1.192 milivolts produced per thermocouple. This is 0.001192 volts. With 100 thermocouples in series there will be 0.1192 volts per inch and 1.192 volts for ten inches and 11.92 volts for 100 inches with only 10,000 thermocouples in series. With a total of 3 thousandths of an inch thickness for the strip and thermocouples, this 100 inch strip will effectively produce 12 volts and be wound in a coil of approximately ¼ inches. Of course, the strip may be wound to define a generally rectangular pattern or be formed as a plurality of shorter strips in series totaling 1000 inches will have 119.2 volts or 120 volts DC available. From this point on, it is simply an electrical connection either in series or in parallel to get any voltage for any current voltage relationship desired.

With reference to FIG. 2, a second substrate strip designated at 50, is identical with strip 10 and all reference numerals are the same with prime designations, with the exceptions of the end terminal tabs 52, 54 which extend outwardly from opposed lower side edge portions of strip 50 and are simularly coated with the first metal such as copper and electrically connect to end first legs 16'. It should be noted that the terminal tabs 28, 30 of first strip 10, and 52, 54 of second strip 50 extend respectively down from the top edge of strip 10 and up from the bottom edge of strip 50 for distances of less than one-half the heights thereof to define a space 56 therebetween, FIG. 4.

Figure 4:
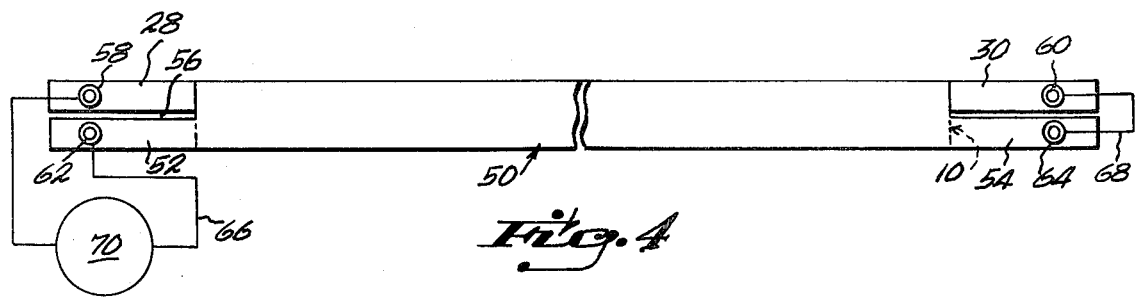
FIG. 4 is an end elevational view of a bundle of alternating first and second strips, electrically interconnected to enhance the temperature differential between the hot and cold sides thereof.
Figure 5:
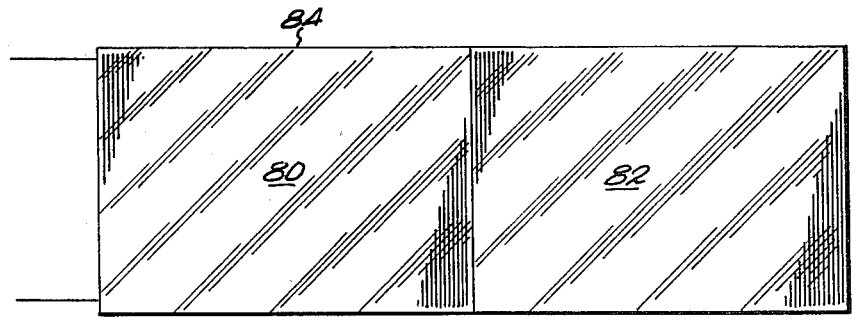
FIG. 5 is a plan view of a pair of typical thermoelectric generator panels of the present invention.

To enhance the temperature differential by using another part of the Seebeck effect, the strips 10 and 50 are alternated as illustrated in FIGS. 3 and 4. Very substantial numbers of each strip 10 and 50 are stacked together to define a panel, two illustrated in series at 80, 82 in FIG. 5.

All of the strips 10 are electrically interconnected in parallel as at 58, 60 in FIG. 4 through the terminal tabs 28, 30, and the strips 50 are simularly interconnected at 62, 64 through the terminal tabs 52, 54. By applying a voltage and current between the terminal lugs as by leads 66, 68 a voltage and current is applied between the terminals causing a thermal cooling effect where the normally cooler bottom will actively become cooled thermoelectrically instead of by radiation. The heat that is removed from the lower or cool couples 22' of strips 50 is then transferred to the top or hot couples 20 of strip 10. A voltage regulator 70 is disposed in lead 66 to limit the electrical transfer to the top couples 20. The heat taken from the lower couples 22' which would have been lost through radiation, will be pumped back up to the top couples and its heat energy will be added to the normal heat energy of said top couples 20, received from a solar or other source. When the top couples 20 of strip 10 receives energy from a heated source, the top surface will invariably be warmer than the lower surface, causing initial electrical production.

Once this first relatively small amount of energy which is fed to the second parallel strip 50 which is in intimate contact with the first strip 10, an enhancing or regenerative process commences. Regeneration refers to the capability of the second strip 50 to produce a cool lower junction at 22' and to pump the heat to the heated junction at 20 of strip 10 to enhance the electrical production. As the temperature differential increases between the heated or energy receiving couplers 20 of strips 10 and the cool couplers or junctions 22' of the strips 50 which are now being cooled thereby, the electromotive force will rise very substantially. The current will also increase due to the raising of the voltage being produced by the enhanced combination of the two alternating pluralities of thermocouple strips 10 and 50.

Each panel such as 80 will be encased or sealed as at 84 against the weather, the top side exposed to the heat will be designed to absorb a maximum amount of heat while the bottom or cool side will be insulated from any heat producing source such as a roof.

Figure 6:
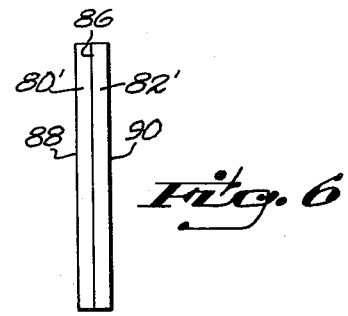
FIG. 6 is an edge view of a pair of panels disposed in a sandwich mode with the hot sides thereof turned outwardly and the cold sides thereof in an abutting relationship.

As illustrated in FIG. 6 two panels 80' and 82' are disposed in a manner whereby two cooled surfaces are abutted as at 86 while two hotter sides 88, 90 face oppositely outwardly to absorb heat from any available source.

The applications of the above described equipment is virtually unlimited, for residential power conversion where panels as above described may be placed on the roof in any necessary numbers to directly produce electrical energy for the home owner and also including commercial and industrial applications as well as for the propulsion of vehicles and vessels of all types.

METHOD OF PRODUCING THE THERMOELECTRIC PANELS OF THE PRESENT INVENTION

Figure 7:
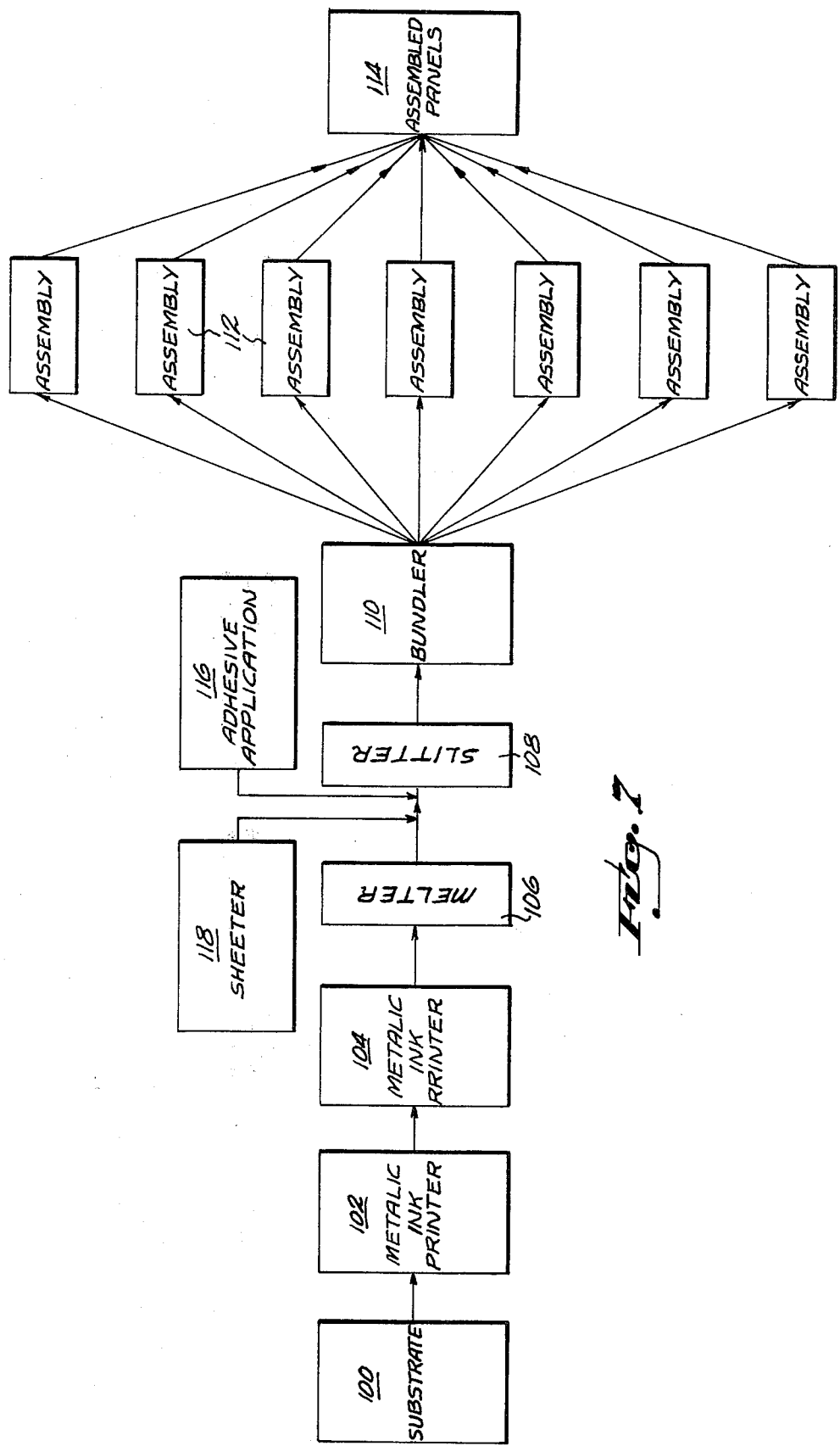
FIG. 7 is a schematic view illustrating the steps of producing the thermoelectric panels.

With reference to FIG. 7, a first station 100 is provided with a substrate supply in sheet form in a first application. From the substrate supply station 100, the sheets are sequentially fed through first and second metalic ink printers 102, 104 to print pluralities of rows of thermcouples, in series, in accordance with the present invention, across the width of each sheet. The respective inks are formed by suitable mixtures of finely powdered different metals and a carrier or flux.

From the second ink printer 104, the sheets are passed through a melter 106 where the metalic particles of the thermocouple designs are melted into a solid mass causing an intermingling of the metals at all of couple connections 20, 22.

From the melter station 106, the sheets are passed through a slitter station 108 where they are slit into a plurality of thermocouple strips such as 10 and 50 and rotated transversely through 90 degrees into a face to face relationship for passage into a bundler station 110 where the strips of each sheet are packed into a bundle.

From the bundler station 110, the bundles are sequentially fed to one of a plurality of assembly stations 112 where the bundles are assembled into panels such as 80, 82 (FIG. 5) and from the assembly stations 112, the finished panels are fed to an assembled panel collection station 114.

An adhesive application station 116 is preferably interposed between the melter and slitter stations 106, 108 to secure the strips such as 10 and 50 in a bundle form.

In the event the substrate 14 is provided in a roll form, a sheeter station 118 is provided after the melter station 106.

I claim:

1. A thermoelectric generator device comprising a suitable substrate strip of a predetermined length and width and having a plurality of spaced apart first and second thermocouple element legs disposed generally along its length in an adjacent relationship, said legs being printed respectively in first and second inks composed of powdered metals, of different electrical conductivity, mixed in a suitable binder; said legs further including oppositely extending overlying printed couple portions at their ends to connect the legs of different conductivity in a manner whereby said legs are electrically coupled to define a first plurality of thermocouples in series; said powdered metals being melted on said substrate to form a solid mass of said legs and couples, with an intermingling of said first and second metals of said couples.

2. The device as defined in claim 1 including a first plurality of said strips, each with said first thermocouple series printed thereon, disposed in a front to back side contact relation to define a generally rectangular configuration; each of said strips including first and second connector tabs extending outwardly from respective ends in electrical connection respectively with opposite ends of said first series of thermocouples.

3. The device as defined in claim 2 including first and second electrical connector means extending respectively through said first and second connector tabs in a manner so as to electrically interconnect all of said first thermocouple series in parallel.

4. The device as defined in claim 3 wherein said first and second connector tabs are of a width extending from a top longitudinal edge of said strip to a point somewhat less than one-half of said predetermined width.

5. The device as defined in claim 4 including a second plurality of said strips, sequentially interposed in a front to back relation between each pair of said first plurality of strips, each of said second plurality of strips including a second thermocouple series, similar to said first thermocouple series, printed and melted thereon, and including third and fourth connector tabs extending outwardly from respective ends thereof, said third and fourth connector tabs being of a width extending from a lower longitudinal edge of said second strip to a point somewhat less than one-half of said predetermined width.

6. The device as defined in claim 5 including third and fourth electrical connector means extending through said third and fourth connector tabs in a manner so as to electrically interconnect all of said second thermocouple series in parallel.

7. The device as defined in claim 6 including electric circuit means connecting between said first and second, and said third and fourth connector means.

8. The device as defined in claim 7 including control means interposed in said electric circuit means to control the amount of electricity circulating between said first and second thermocouple series due to exposure of top edge portions of said first and second thermocouple series to a heat source.

9. The device as defined in claim 5 wherein said first and second strips predetermined width is within a range between one-quarter and one-half inch.

10. The device as defined in claim 9 wherein the number of thermocouples printed on said first and second strips is preferably in excess of 100 per linear inch.

11. A method of forming a thermoelectric generator device comprising the steps of providing a supply of substrate sheets of a predetermined length and width, feeding said sheets sequentially through first and second metalic ink printers, to define a plurality of side by side lengthwise lines of thermocouples connected in series on each sheet, said first metalic ink printer applyng first leg and end couple portions of the thermocouples in a first ink composed of a first powdered metal and a proper binder, and said second metalic ink printer applying second leg and end couple portions of the thermocouples in a second ink composed of a second powdered metal, of a different conductivity type, with said first and second coupler portions being in an overlying relation in a manner so as to define said series relationship of said thermocouples; passing said printed thermocouples through a melter to form said legs and couples into a solid metal mass with an intermingling of said first and second powdered metals at said couples; slitting said sheets into strips relative to said lengthwise lines of thermocouples; passing said strips into a bundler where the strips of each sheet are bundled into a front to back face relationship; passing said bundles to at least one assembly station where said bundles are assembled into panels of a generally rectangular configuration; and passing said panels to an assembled panel collection station.

12. The method as defined in claim 11 wherein said bundles are sequentially fed to a plurality of assembly stations for assembly into panels.

13. The method as defined in claim 12 wherein bottom end couples, of said end couples, of all first alternating strips are electrically connected to top end couples, of said end couples, of all second alternating strips, at said assembly stations.

14. The method as defined in claim 11 wherein said supply of substrate is in roll form, and a sheeter is provided between said melter and slitter to cut said substrate into said sheet form.

15. The method as defined in claim 11 including an adhesive application station between said melter and slitter to apply adhesive to said sheets prior to the slitting process.

16. The method as defined in claim 13 including the installation of control means in said electrical connection to control the amount of electricity circulating between said bottom couples of first alternating strips and said top couples of second alternating strips.

* * * * *